(12) United States Patent
Simpson (10) Patent No.: US 6,197,688 B1
(45) Date of Patent: Mar. 6, 2001

(54) INTERCONNECT STRUCTURE IN A SEMICONDUCTOR DEVICE AND METHOD OF FORMATION

(75) Inventor: Cindy Reidsema Simpson, Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/022,933

(22) Filed: Feb. 12, 1998

(51) Int. Cl.[7] ................ H01L 21/44; H01L 21/302; H01L 21/4763
(52) U.S. Cl. ............... 438/678; 438/687; 438/629
(58) Field of Search .................... 438/678, 687, 438/629

(56) References Cited

U.S. PATENT DOCUMENTS

| | | |
|---|---|---|
| 3,844,799 | 10/1974 | Underkofler et al. .............. 106/1 |
| 5,063,169 | 11/1991 | De Bruin et al. ................. 437/41 |
| 5,079,600 * | 1/1992 | Schnur et al. ................... 357/4 |
| 5,169,680 | 12/1992 | Ting et al. ...................... 427/96 |
| 5,266,446 | 11/1993 | Chang et al. .................... 430/314 |
| 5,447,887 * | 9/1995 | Filipiak et al. ................. 437/200 |
| 5,674,787 | 10/1997 | Zhao et al. ..................... 437/230 |
| 5,824,599 * | 10/1998 | Schacham-Diamand et al. .. 438/678 |
| 5,913,147 * | 6/1999 | Dubin et al. .................... 438/687 |
| 5,953,594 * | 9/1999 | Bhatt et al. ..................... 438/125 |
| 5,969,422 * | 10/1999 | Ting et al. ...................... 257/762 |
| 6,077,780 * | 6/2000 | Dubin ............................ 438/687 |

OTHER PUBLICATIONS

Making The Move To Dual Damascene Processing; Semiconductor International; Aug. 1997; pp. 79–81.

* cited by examiner

Primary Examiner—Richard Booth
Assistant Examiner—Jennifer M. Kennedy (57) ABSTRACT

In one embodiment, a conductive interconnect (38) is formed in a semiconductor device by depositing a dielectric layer (28) on a semiconductor substrate (10). The dielectric layer (28) is then patterned to form an interconnect opening (29). A tantalum nitride barrier layer (30) is then formed within the interconnect opening (29). A catalytic layer (31) comprising a palladium-tin colloid is then formed overlying the tantalum nitride barrier layer (30). A layer of electroless copper (32) is then deposited on the catalytic layer (31). A layer of electroplated copper (34) is then formed on the electroless copper layer (32), and the electroless copper layer (32) serves as a seed layer for the electroplated copper layer (34). Portions of the electroplated copper layer (34) are then removed to form a copper interconnect (38) within the interconnect opening (29).

15 Claims, 5 Drawing Sheets

INTERCONNECT STRUCTURE IN A SEMICONDUCTOR DEVICE AND METHOD OF FORMATION

FIELD OF THE INVENTION

This invention relates generally to semiconductor devices, and more specifically to an interconnect structure in a semiconductor device and its method of formation.

BACKGROUND OF THE INVENTION

In the semiconductor industry, conductive interconnects have traditionally been formed using Chemical Vapor Deposition (CVD) and Physical Vapor Deposition (PVD) processes. Currently, PVD processes are preferred due to cost, ease of deposition, and availability of equipment. However, as the critical dimensions of semiconductor devices shrink, the aspect ratio of contact and via openings increase, and it is difficult to form a conformal film within these openings using PVD processes. Thus, current PVD processes provide poor step coverage within high aspect ratio openings, and interconnect structures formed often contain voids. These voids reduce the overall conductivity of the interconnect structure, and they adversely effect the reliability of semiconductor device. CVD processes, on the other hand, typically provide a more conformal film than PVD processes. CVD processes, however, require expensive processing equipment, frequent downtime for cleaning, and use a high cost low efficiency chemical precursor. In addition, interconnect structures formed in high aspect ratio openings, using CVD techniques, also suffer from void formation and adhesion of these films to underlying dielectric materials is often problematic. Therefore, a need exists for a metallization process that deposits highly conformal films within high aspect ratio openings, and that can be used to reduce void formation in interconnect structures.

DETAILED DESCRIPTION OF THE DRAWINGS

Figure 1:
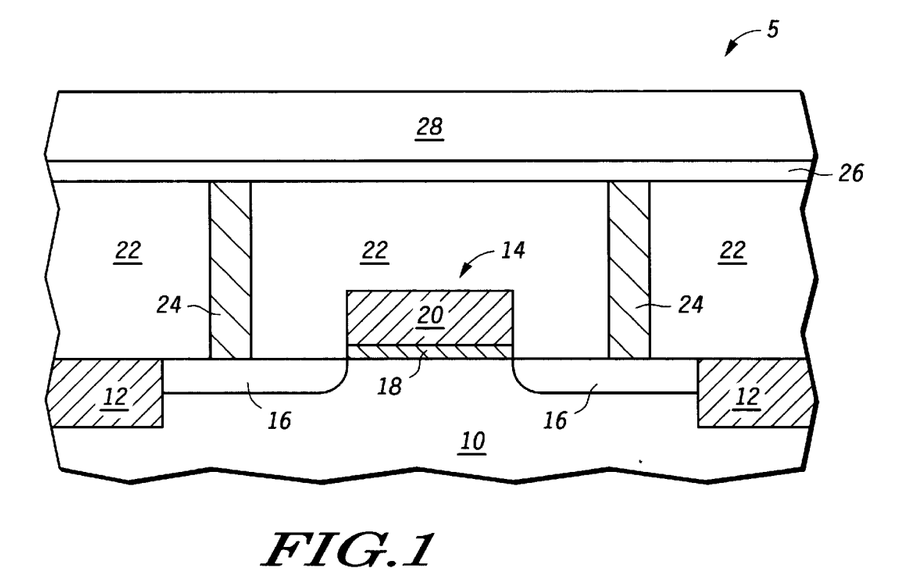
FIGS. 1–8 illustrate, in cross-section, process steps in accordance with one embodiment of the invention.

Shown in FIG. 1 is a portion 5 of an integrated circuit structure in accordance with one embodiment of the present invention. The integrated circuit structure comprises a semiconductor substrate 10, field isolation regions 12, a transistor 14, conductive plugs 24, a dielectric layer 22, an etch stop layer 26, and a dielectric layer 28. Transistor 14 comprises source/drain regions 16, a gate dielectric layer 18, and a gate electrode 20. In one embodiment, semiconductor substrate 10 is a monocrystalline silicon substrate. Alternatively, semiconductor substrate 10 may be a silicon-on-insulator substrate, a silicon-on-sapphire substrate, or the like.

In one embodiment, field isolation regions 12 are trench isolation regions which are formed using conventional etching and chemical mechanical polishing techniques. Alternatively, field isolation regions 12 may be field oxide regions which are formed using conventional techniques, such as local oxidation of silicon (LOCOS), poly-buffered LOCOS (PBL), polysilicon encapsulated local oxidation (PELOX), or the like.

In one embodiment, gate dielectric layer 18 is a layer of thermal silicon dioxide which is formed by thermally oxidizing a portion of semiconductor substrate 10. Alternatively, gate dielectric layer 18 may be a layer of silicon nitride, a layer of silicon oxynitride, a layer of chemically vapor deposited silicon dioxide, a nitrided oxide layer, or a combination thereof.

In one embodiment, gate electrode 20 is a layer of polysilicon. Alternatively, gate electrode 20 may be a metal layer, such as tungsten or molybdenum, a metal nitride layer, such as titanium nitride or tungsten nitride, or a combination thereof. In addition, gate electrode 20 may be a polycide layer comprising a metal silicide layer, such as tungsten silicide, titanium silicide, or cobalt silicide, overlying a polysilicon layer.

In one embodiment, dielectric layer 22 is a layer of plasma deposited oxide which is formed using TEOS as a source gas. Alternatively, dielectric layer 22 may be a layer of silicon nitride, a layer of PSG, a layer of BPSG, an SOG layer, a silicon oxynitride layer, a polyimide layer, a low dielectric constant insulator, or a combination thereof.

In one embodiment, conductive plugs 24 are formed using a titanium/titanium nitride barrier layer and a tungsten contact fill. After being deposited portions of the tungsten and the underlying titanium/titanium nitride barrier layer are removed using conventional etching or chemical mechanical polishing techniques to form conductive plugs 24. Alternatively, conductive plugs 24 may be formed using polysilicon as a contact fill material.

In one embodiment, etch stop layer 26 is a layer of silicon oxynitride which is formed using conventional plasma deposition techniques. Alternatively, etch stop layer 26 may be a layer of plasma deposited silicon nitride, a boron nitride layer, or the like.

In one embodiment, dielectric layer 28 is a layer of plasma deposited oxide which is formed using TEOS as a source gas. Alternatively, dielectric layer 28 may be a layer of silicon nitride, a layer of PSG, a layer of BPSG, an SOG layer, a silicon oxynitride layer, a polyimide layer, a low dielectric constant insulator, or the like. In addition, a combination of the foregoing dielectric materials may also be used to form dielectric layer 28.

Figure 2:
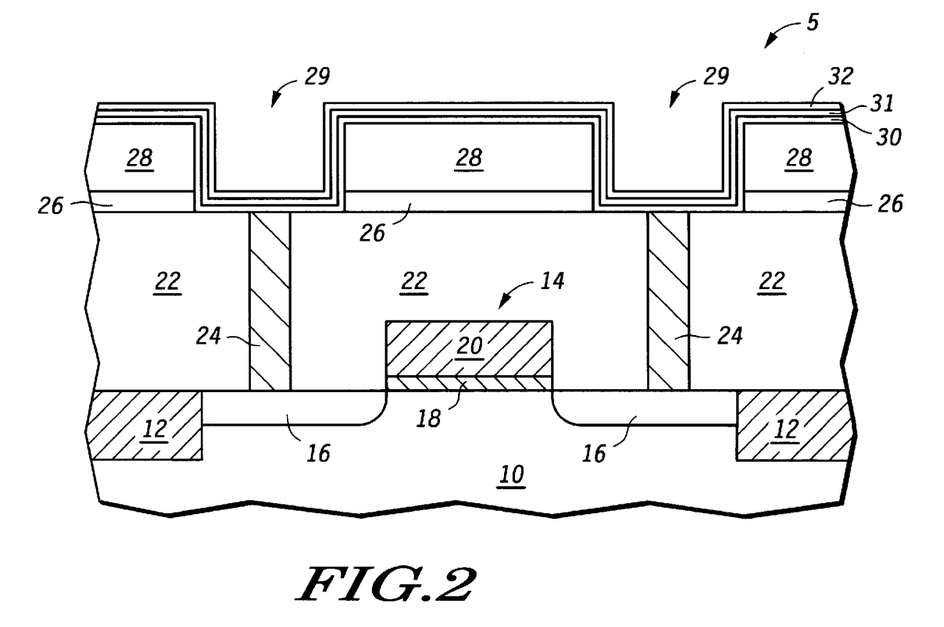

In FIG. 2, a portion of dielectric layer 28 and a portion of etch stop layer 26 are then removed to expose a portion of conductive plugs 24 and form interconnect openings 29. A conductive barrier layer 30 is then formed within interconnect openings 29. In one embodiment, conductive barrier layer 30 is a layer of tantalum nitride. Alternatively, conductive barrier layer 30 may be a layer of titanium nitride, a layer of tungsten nitride, a layer of tantalum silicon nitride, a layer of tantalum, a titanium-tungsten layer (TiW), or the like. Conductive barrier layer 30 may be deposited using conventional sputtering or chemical vapor deposition techniques.

A catalytic layer 31 for an electroless deposition process is then formed overlying conductive barrier layer 30 using conventional techniques. In one embodiment, catalytic layer 31 comprises a palladium-tin (Pd—Sn) colloid. In this particular embodiment, conductive barrier layer 30 is etched in an acidic solution, prior to forming the layer comprising the palladium-tin colloid, in order to remove any oxide that may have formed upon the outer surface of conductive barrier layer 30. For example, if conductive barrier layer 30 comprises titanium nitride, a sulfuric acid solution can be used to remove any titanium oxide that may have formed upon the top surface of the titanium nitride barrier layer.

Similarly, if conductive barrier layer 30 comprises tantalum or tantalum nitride, a solution of hydrofluoric acid can be used to remove any tantalum pentoxide formed on the top surface of the tantalum or tantalum nitride barrier layer. Etching of conductive barrier layer 30 has been found to increase adhesion of catalyst layer 31 to underlying conductive barrier layer 30. It should be appreciated that if conductive barrier layer 30 is not prone to oxide formation, then the foregoing etch process may not be required. Alternatively, catalytic layer 31 may be formed using other metal colloids or other conductive materials, such as copper or gold. For example, a catalytic layer comprising platinum may be formed overlying conductive barrier layer 30 using platinic acid. Similarly, a catalytic layer comprising palladium may be formed overlying conductive barrier layer 30 using palladium chloride.

A conductive seed layer 32 is then formed overlying catalytic layer 31 using an electroless deposition process. Conductive seed layer 32 has thickness which is insufficient to fill interconnect openings 29, as shown in FIG. 2, but is thick enough to conduct and carry current densities required for electroplating so that it can be used as an electroplating seed layer. In one embodiment, conductive seed layer 32 is a layer of copper having a thickness of approximately 500 angstroms. In this particular embodiment, the electroless copper layer is plated onto the underlying catalytic layer 31 using an electroless plating solution comprising cupric ions, formaldehyde, and ethylenediaminetetraacetic acid (EDTA).

Alternatively, conductive seed layer 32 may also be formed using other conventional copper plating solutions or with other conductive materials that can be plated onto catalytic layer 31 with an electroless process. For example, conductive seed layer 32 may be a layer of electroless nickel, electroless tin, electroless silver, electroless palladium, or electroless gold.

It is important to note that the electroless deposition process allows conductive seed layer 32 to be conformally deposited into high aspect ratio openings with good step coverage.

Figure 3:
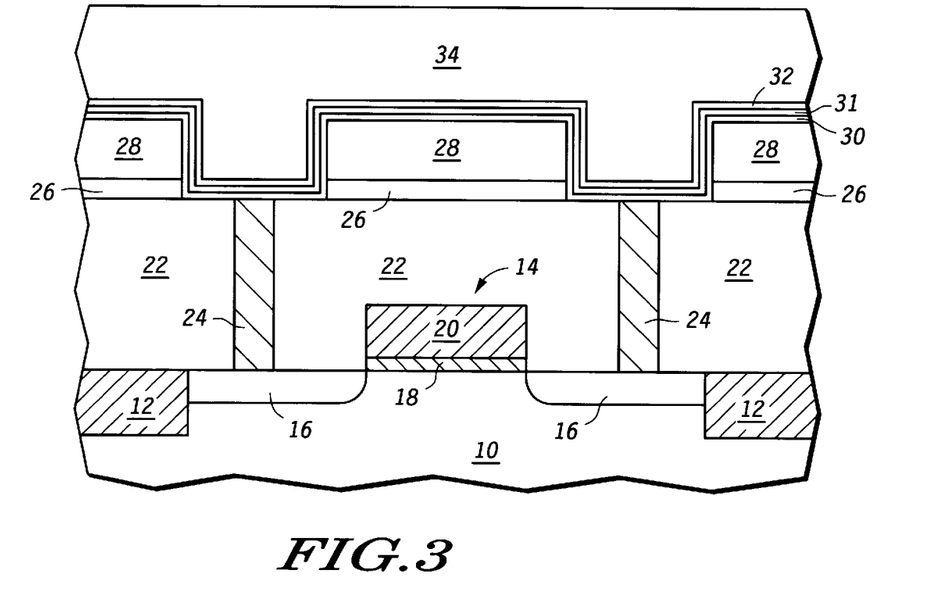

In FIG. 3, an electroplating process is then used to form a conductive metal layer 34 overlying conductive seed layer 32. Conductive metal layer 34 has a thickness which is sufficient to fill interconnect openings 29, as shown in FIG. 3. In one embodiment, conductive metal layer 34 is a layer of copper which is deposited using a plating solution comprising copper (Cu), copper sulfate ($Cu_2SO_4$), sulfuric acid ($H_2SO_4$), and chloride ions, such as those from hydrochloric acid (HCl). In this particular embodiment, the electric current density is modified near the edges of the semiconductor substrate during the copper electroplating process in order to improve the copper electroplating uniformity, as is described in U.S. patent application Ser. No. 08/856,459, which is assigned to the assignee of the present application. The subject matter of U.S. patent application Ser. No. 08/856,459 is expressly incorporated herein by reference. Alternatively, conductive metal layer 34 may be formed using conventional electroplating techniques, and may be formed using other conductive materials, such as nickel or gold. It is important to note that conductive seed layer 32 serves as the seed layer for the foregoing electroplating process. Therefore, openings having a high aspect ratio can be reliably filled with conductive metal layer 34 because conductive seed layer 32, which can be conformally deposited within high aspect ratio openings, allows conductive metal layer 34 to be subsequently deposited with high conformality into the same high aspect ratio openings.

Figure 4:
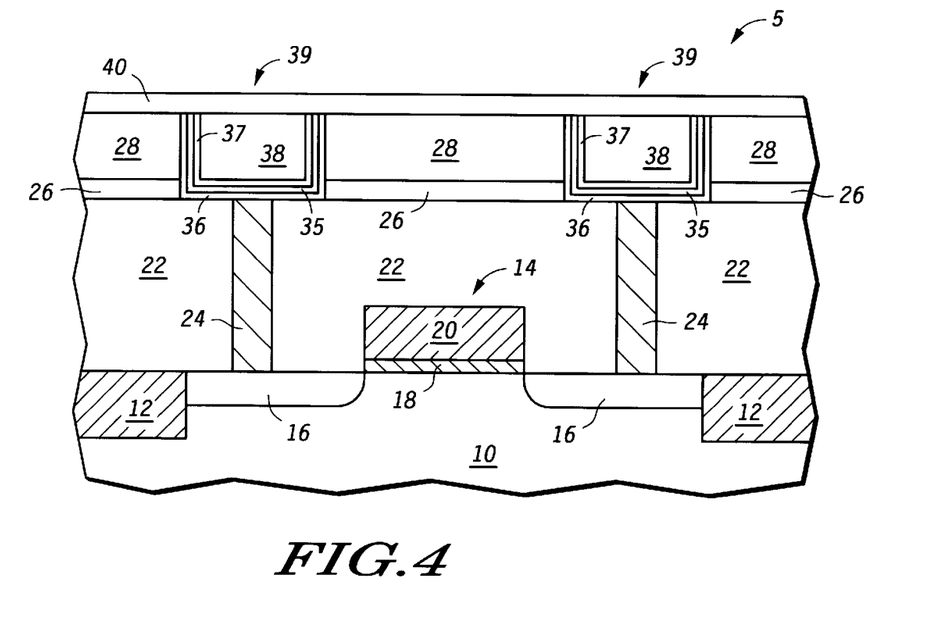

In FIG. 4, portions of conductive metal layer 34, conductive seed layer 32, catalytic layer 31, and conductive barrier layer 30 are removed to form conductive interconnects 39 within interconnect openings 29, shown in FIG. 2, wherein conductive interconnects 39 comprise a remaining portion 36 of conductive barrier layer 30, a remaining portion 35 of catalytic layer 31, a remaining portion 37 of conductive seed layer 32, and a remaining portion 28 of conductive metal layer 34. In particular embodiments wherein conductive metal layer 34 and conductive seed layer 32 are copper, catalytic layer 31 comprises palladium, and conductive barrier layer 30 comprises titanium, tungsten, or tantalum, conductive interconnects 39 may be formed with a chemical mechanical polishing process that uses a polishing slurry comprising hydrogen peroxide, ammonium citrate, alumina, 1,2,4-triazole, and deionized water, as is described in U.S. Pat. No. 5,897,375, which is assigned to the assignee of the present application. The subject matter of U.S. Pat. No. 5,897,375 is expressly incorporated herein by reference. Alternatively, conductive interconnects 39 may be formed using conventional etching techniques, such as ion-beam milling, reactive ion-beam etching, and plasma etching, or using a combination of etching and polishing techniques. It should be appreciated that the electroless plating process in combination with the electroplating process allow conductive interconnects 39 to be reliably formed in high aspect ratio openings with low resistance.

A barrier layer 40 is then formed overlying conductive interconnects 39. In one embodiment, barrier layer 40 is a layer of plasma deposited silicon nitride. Alternatively, barrier layer 40 may be a layer of plasma deposited silicon oxynitride, a layer of boron nitride, or the like. Barrier layer 40 is used to prevent metal atoms within conductive interconnects 39 from diffusing into overlying dielectric layers which are subsequently deposited over conductive interconnects 39. For example, if conductive interconnects 39 comprise copper then barrier layer 40 serves as a copper diffusion barrier.

Figure 5:
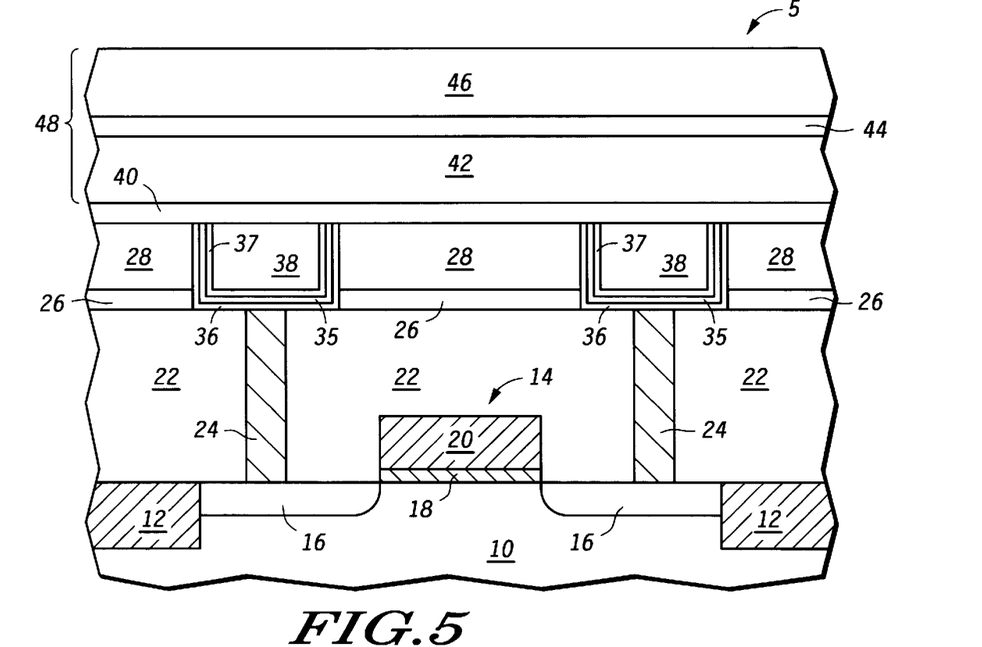

An interlevel dielectric layer 48 is formed overlying barrier layer 40. In one embodiment, interlevel dielectric layer 48 comprises dielectric layer 42, etch stop layer 44 and dielectric layer 46, as shown in FIG. 5.

Dielectric layer 42 may be a layer of plasma deposited oxide which is deposited using TEOS as a source gas. Alternatively, dielectric layer 42 may be a layer of PSG, a layer of BPSG, an SOG layer, a polyimide layer, a low dielectric constant insulator, or the like.

Etch stop layer 44 may be a layer of plasma deposited silicon oxynitride. Alternatively, etch stop layer 44 may be a layer of plasma deposited silicon nitride, a layer of born nitride, or the like.

Dielectric layer 46 may be a layer of plasma deposited oxide which is formed using TEOS as a source gas. Alternatively, dielectric layer 46 may be a layer of PSG, a layer of BPSG, an SOG layer, a polyimide layer, a low dielectric constant insulator, or the like. It should be appreciated that interlevel dielectric layer 48 need not be formed using different dielectric material. For example, interlevel dielectric layer 48 could be formed using a single dielectric material, such as plasma deposited oxide, PSG, BPSG, SOG, polyimide, a low dielectric constant insulator, or the like.

Figure 6:
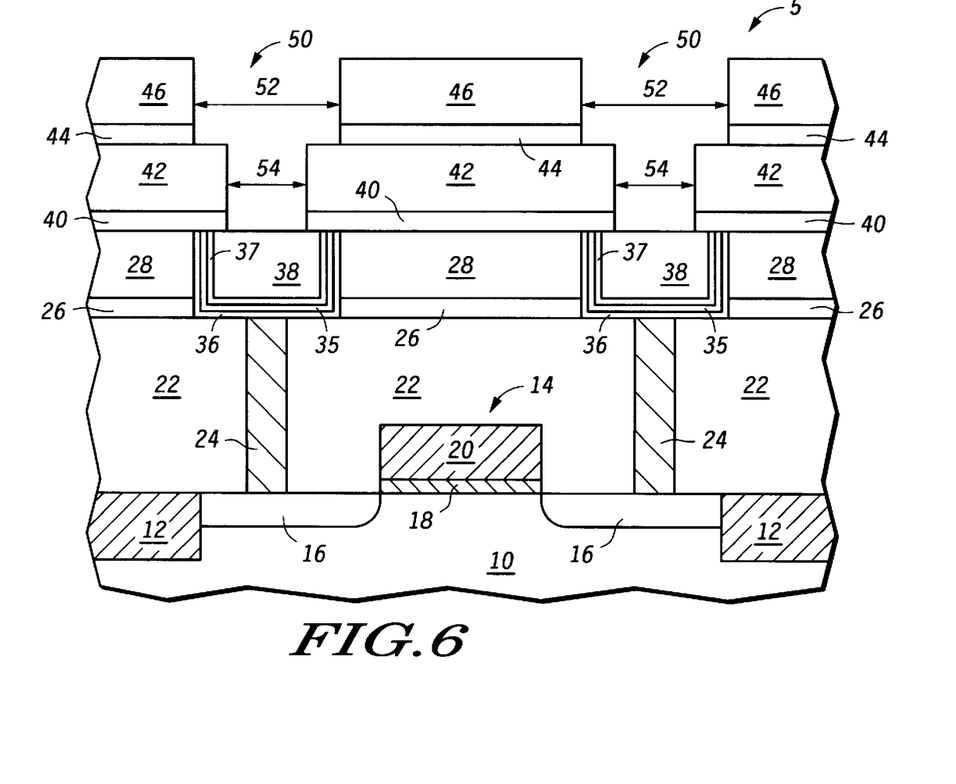

In FIG. 6, a portion of interlevel dielectric layer 48 and a portion of barrier layer 40 are patterned to form dual inlaid openings 50 within interlevel dielectric layer 48. As shown in FIG. 6, dual inlaid openings 50 comprise an interconnect portion 52 and a via portion 54, wherein via portions 54 expose a portion of conductive interconnects 39. During the patterning process etch stop layer 44 protects dielectric layer 42 when dielectric layer 46 is etched to form interconnect portions 52.

Figure 7:
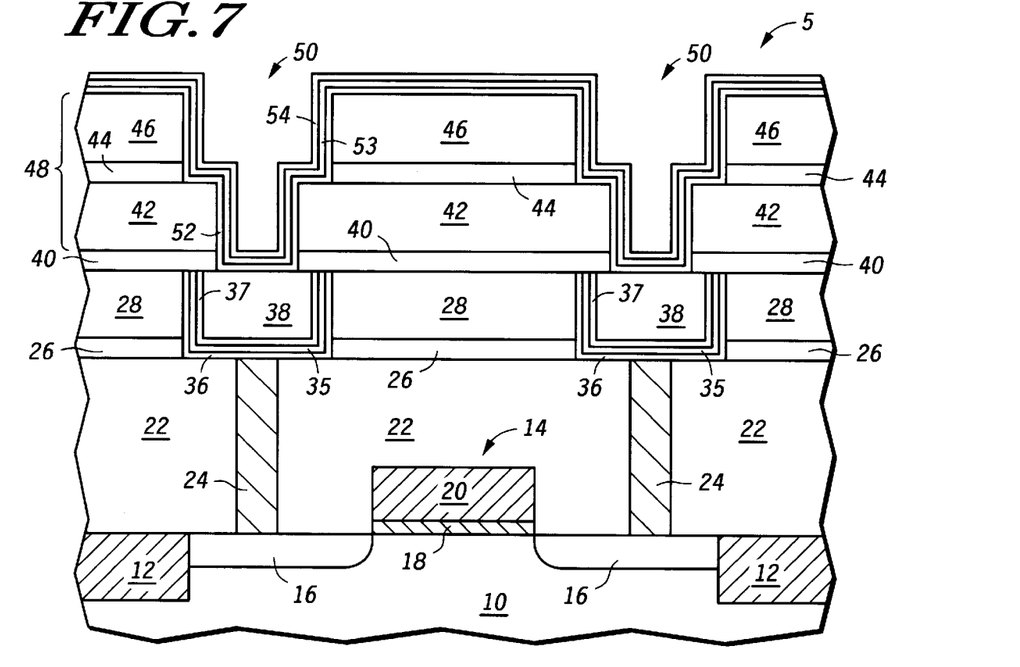

In FIG. 7, a conductive barrier layer 52 is then formed within dual inlaid openings 50. In one embodiment, conductive barrier layer 52 is a layer of tantalum nitride. Alternatively, conductive barrier layer 52 may be a layer of titanium nitride, a layer of tungsten nitride, a layer of tantalum silicon nitride, a layer of tantalum, a titanium-tungsten layer (TiW), or the like. Conductive barrier layer 52 may be deposited using conventional sputtering or chemical vapor deposition techniques.

A catalytic layer 53 for an electroless deposition process is then formed overlying conductive barrier layer 52 using conventional techniques. In one embodiment, catalytic layer 53 comprises a palladium-tin (Pd—Sn) colloid. In this particular embodiment, conductive barrier layer 52 is etched in an acidic solution, prior to forming the layer comprising the palladium-tin colloid, in order to remove any oxide that may have formed upon the outer surface of conductive barrier layer 52. For example, if conductive barrier layer 52 comprises titanium nitride, a sulfuric acid solution can be used to remove any titanium oxide that may have formed upon the top surface of the titanium nitride barrier layer. Similarly, if conductive barrier layer 52 comprises tantalum or tantalum nitride, a solution of hydrofluoric acid can be used to remove any tantalum pentoxide formed on the top surface of the tantalum or tantalum nitride barrier layer. Etching of conductive barrier layer 52 has been found to increase adhesion of catalyst layer 53 to underlying conductive barrier layer 52. It should be appreciated that if conductive barrier layer 52 is not prone to oxide formation, then the foregoing etch process may not be required. Alternatively, catalytic layer 53 may be formed using other metal colloids or other conductive materials, such as copper or gold. For example, a catalytic layer comprising platinum may be formed overlying conductive barrier layer 52 using platinic acid. Similarly, a catalytic layer comprising palladium may be formed overlying conductive barrier layer 52 using palladium chloride.

A conductive seed layer 54 is then formed overlying catalytic layer 53 using an electroless deposition process. Conductive seed layer 54 has a thickness which is insufficient to fill dual in-laid openings 50, as shown in FIG. 7. In one embodiment, conductive seed layer 54 is a layer of copper having a thickness of approximately 500 angstroms. In this particular embodiment, the electroless copper layer is plated onto the underlying catalytic layer 53 using an electroless plating solution comprising cupric ions, formaldehyde, and ethylenediaminetetraacetic acid (EDTA).

Alternatively, conductive seed layer 54 may also be formed using other conventional copper plating solutions or with other conductive materials that can be plated onto catalytic layer 53 with an electroless process. For example, conductive seed layer 54 may be a layer of electroless nickel, electroless tin, electroless silver, electroless palladium, or electroless gold.

It is important to note that the electroless deposition process allows conductive seed layer 54 to be conformally deposited into high aspect ratio openings with good step coverage.

Figure 8:
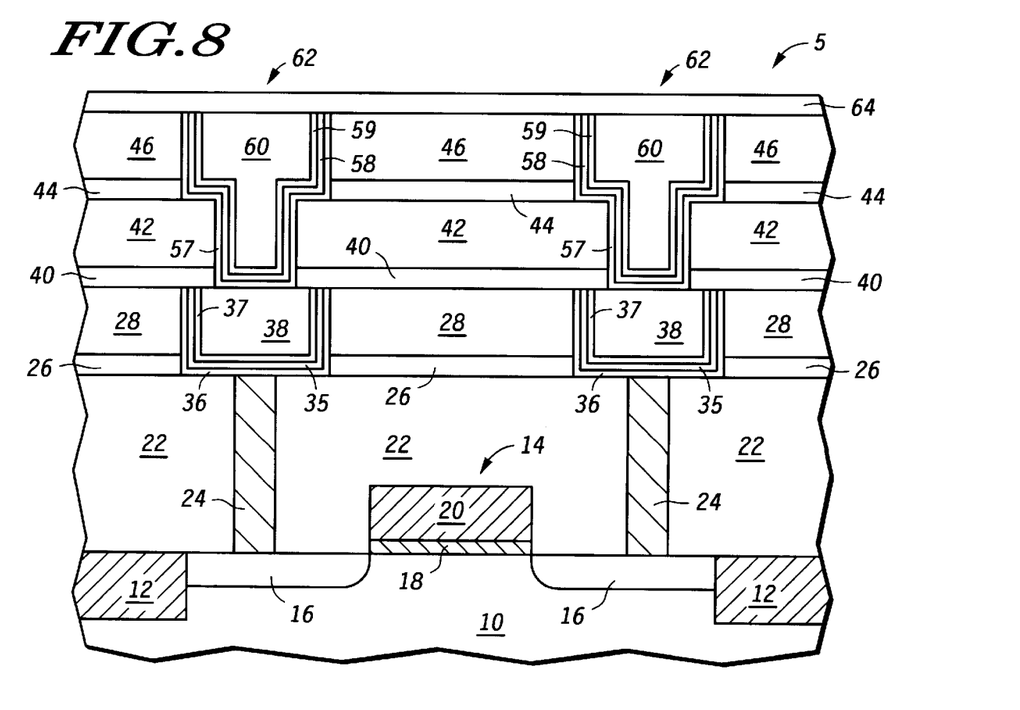

In FIG. 8, an electroplating process is then used to form a conductive metal layer overlying conductive seed layer 54. The conductive metal layer has a thickness which is sufficient to fill dual inlaid openings 50. In one embodiment, the conductive metal layer is a layer of copper which is deposited using a plating solution comprising copper (Cu), copper sulfate ($Cu_2SO_4$), sulfuric acid ($H_2SO_4$), and chloride ions, such as those from hydrochloric acid (HCl). In this particular embodiment, the electric current density is modified near the edges of the semiconductor substrate during the copper electroplating process in order to improve the copper electroplating uniformity, as previously described in FIG. 3. Alternatively, the conductive metal layer may be formed using conventional electroplating techniques, or may be formed using other conductive materials, such as nickel or gold. It is important to note that conductive seed layer 54 serves as the seed layer for the foregoing electroplating process. Therefore, openings having a high aspect ratio can be reliably filled with the conductive metal layer because conductive seed layer 54, which can be conformally deposited within high aspect ratio openings, allows conductive the metal layer to be subsequently deposited with high conformality into the same high aspect ratio openings.

In FIG. 8, portions of the conductive metal layer, conductive seed layer 54, catalytic layer 53, and conductive barrier layer 52 are removed to form conductive interconnects 62 within dual inlaid openings 50, wherein conductive interconnects 62 comprise a remaining portion 57 of conductive barrier layer 52, a remaining portion 58 of catalytic layer 53, a remaining portion 59 of conductive seed layer 54, and a remaining portion 60 of the conductive metal layer. In particular embodiments wherein conductive the metal layer and conductive seed layer 54 are copper, catalytic layer 53 comprises palladium, and conductive barrier layer 52 comprises titanium, tungsten, or tantalum, conductive interconnects 62 may be formed with a chemical mechanical polishing process that uses a polishing slurry comprising hydrogen peroxide, ammonium citrate, alumina, 1,2,4-triazole, and deionized water, as previously described in FIG. 4. Alternatively, conductive interconnects 62 may be formed using conventional etching techniques, such as ion-beam milling, reactive ion-beam etching, and plasma etching, or using a combination of etching and polishing techniques. It should be appreciated that the electroless plating process in combination with the electroplating process allow conductive interconnects 62 to be reliably formed in high aspect ratio openings with low resistance.

A barrier layer 64 is then formed overlying conductive interconnects 62. In one embodiment, barrier layer 64 is a layer of plasma deposited silicon nitride. Alternatively, barrier layer 64 may be a layer of plasma deposited silicon oxynitride, a layer of boron nitride, or the like. Barrier layer 64 is used to prevent metal atoms within conductive interconnects 62 from diffusing into overlying dielectric layers which are subsequently deposited over conductive interconnects 62. For example, if conductive interconnects 62 comprise copper then barrier layer 64 serves as a copper diffusion barrier.

It should be appreciated that the steps described in FIGS. 5–8 may then be repeated in order to fabricate additional levels of conductive interconnects.

Figure 9:
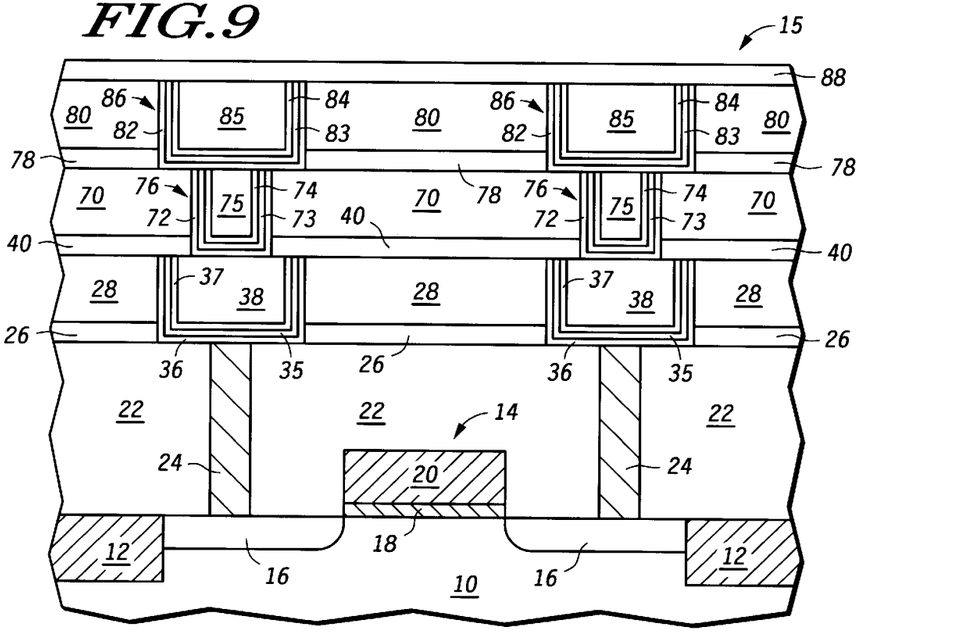
FIG. 9 illustrates, in cross-section, an interconnect structure in accordance with an alternative embodiment of the invention.

Shown in FIG. 9 is a portion 15 of an integrated circuit structure formed in accordance with an alternative embodiment of the present invention. Specifically, FIG. 9 illustrates the formation of multilevel interconnects using single inlaid metallization. In this embodiment of the invention, a dielectric layer 70 is formed overlying the integrated circuit structure shown in FIG. 4. Dielectric layer 70 may be a layer of plasma deposited oxide which is formed using TEOS as a source gas. Alternatively, dielectric layer 70 may be a layer of silicon nitride, a layer of PSG, a layer of BPSG, an SOG layer, a silicon oxynitride layer, a polyimide layer, a low dielectric constant insulator, or the like. In addition, a combination of the foregoing dielectric materials may also be used to form dielectric layer 70. For example, dielectric layer 70 may comprise a silicon oxynitride layer overlying a layer of plasma deposited oxide.

Portions of dielectric layer 70 and portions of barrier layer 40 are then removed to form via openings that expose portions of conductive interconnects 38. A conductive barrier layer, a catalytic layer, a conductive seed layer, and a conductive metal layer are then formed within the via opening as previously described in FIG. 2 and FIG. 3. Portions of the conductive metal layer, the conductive seed layer, the catalytic layer, and the conductive barrier layer are then removed, as previously described in FIG. 4, to form conductive interconnects 76 within the via openings, wherein conductive interconnects 76 comprise a remaining portion 72 of the conductive barrier layer, a remaining portion 73 of the catalytic layer, a remaining portion 74 of conductive seed layer, and a remaining portion 75 of the conductive metal layer.

An etch stop layer 78 is then formed overlying conductive interconnects 76. Etch stop layer 78 may be a layer of plasma deposited silicon oxynitride. Alternatively, etch stop layer 78 may be a layer of plasma deposited silicon nitride, a layer of born nitride, or the like.

A dielectric layer 80 is then formed overlying etch stop layer 78. Dielectric layer 80 may be a layer of plasma deposited oxide which is formed using TEOS as a source gas. Alternatively, dielectric layer 80 may be a layer of silicon nitride, a layer of PSG, a layer of BPSG, an SOG layer, a silicon oxynitride layer, a polyimide layer, a low dielectric constant insulator, or the like. In addition, a combination of the foregoing dielectric materials may also be used to form dielectric layer 80. For example, dielectric layer 80 may comprise a silicon oxynitride layer overlying a layer of plasma deposited oxide.

Portions of dielectric layer 80 and portions of etch stop layer 78 are then removed to form interconnect openings that expose portions of conductive interconnects 76. A conductive barrier layer, a catalytic layer, a conductive seed layer, and a conductive metal layer are then formed within the via opening as previously described in FIG. 2 and FIG. 3. Portions of the conductive metal layer, the conductive seed layer, the catalytic layer, and the conductive barrier layer are then removed, as previously described in FIG. 4, to form conductive interconnects 86 within the interconnect openings, wherein conductive interconnects 86 comprise a remaining portion 82 of the conductive barrier layer, a remaining portion 83 of the catalytic layer, a remaining portion 84 of conductive seed layer, and a remaining portion 85 of the conductive metal layer.

A barrier layer 88 is then formed overlying conductive interconnects 86. In one embodiment, barrier layer 88 is a layer of plasma deposited silicon nitride. Alternatively, barrier layer 88 may be a layer of plasma deposited silicon oxynitride, a layer of boron nitride, or the like. Barrier layer 88 is used to prevent metal atoms within conductive interconnects 86 from diffusing into overlying dielectric layers which are subsequently deposited over conductive interconnects 86. For example, if conductive interconnects 86 comprise copper then barrier layer 88 serves as a copper diffusion barrier.

It should be appreciated that the foregoing steps may be repeated in order to fabricate additional levels of conductive interconnects.

Figure 10:
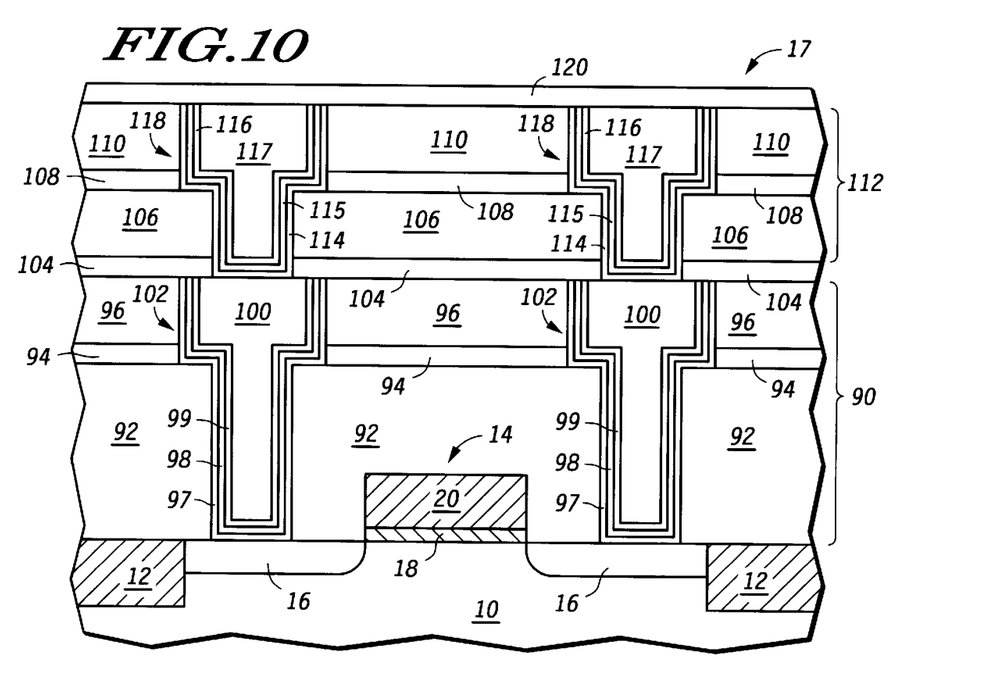
FIG. 10 illustrates, in cross-section, an interconnect structure in accordance with an alternative embodiment of the invention.

Shown in FIG. 10 is a portion 17 of an integrated circuit structure fabricated in accordance with an alternative embodiment of the present invention. Specifically, FIG. 10 illustrates the formation of multilevel interconnects using dual inlaid metallization. In FIG. 10, after transistor 14 and field isolation regions 12 have been formed an interlevel dielectric layer 90 is formed overlying transistor 14 and field isolation regions 12. In one embodiment, interlevel dielectric layer 90 comprises dielectric layer 92, etch stop layer 94 and dielectric layer 96.

Dielectric layer 92 may be a layer of plasma deposited oxide which is deposited using TEOS as a source gas. Alternatively, dielectric layer 92 may be a layer of PSG, a layer of BPSG, an SOG layer, a polyimide layer, a low dielectric constant insulator, or the like.

Etch stop layer 94 may be a layer of plasma deposited silicon oxynitride. Alternatively, etch stop layer 94 may be a layer of plasma deposited silicon nitride, a layer of born nitride, or the like.

Dielectric layer 96 may be a layer of plasma deposited oxide which is formed using TEOS as a source gas. Alternatively, dielectric layer 96 may be a layer of PSG, a layer of BPSG, an SOG layer, a polyimide layer, a low dielectric constant insulator, or the like. It should be appreciated that interlevel dielectric layer 90 need not be formed using different dielectric material. For example, interlevel dielectric layer 90 could be formed using a single dielectric material, such as plasma deposited oxide, PSG, BPSG, SOG, polyimide, a low dielectric constant insulator, or the like.

A portion of interlevel dielectric layer 90 is then patterned to form dual inlaid openings within interlevel dielectric layer 90. The dual inlaid openings comprise an interconnect portion and a via portion, wherein the via portions expose a portion of source/drain regions 16. During the patterning process etch stop layer 94 protects dielectric layer 92 when dielectric layer 96 is etched to form the interconnect portions.

A conductive barrier layer, a catalytic layer, a conductive seed layer, and a conductive metal layer are then formed within the dual inlaid openings as previously described in FIG. 7 and FIG. 8. Portions of the conductive metal layer, the conductive seed layer, the catalytic layer, and the conductive barrier layer are then removed, as previously described in FIG. 8, to form conductive interconnects 102 within the dual inlaid openings, wherein conductive interconnects 102 comprise a remaining portion 97 of the conductive barrier layer, a remaining portion 98 of the catalytic layer, a remaining portion 99 of conductive seed layer, and a remaining portion 100 of the conductive metal layer.

A barrier layer 104 is then formed overlying conductive interconnects 102. In one embodiment, barrier layer 104 is a layer of plasma deposited silicon nitride. Alternatively, barrier layer 104 may be a layer of plasma deposited silicon oxynitride, a layer of boron nitride, or the like. Barrier layer 104 is used to prevent metal atoms within conductive interconnects 102 from diffusing into overlying dielectric layers which are subsequently deposited over conductive interconnects 102. For example, if conductive interconnects 102 comprise copper then barrier layer 104 serves as a copper diffusion barrier.

An interlevel dielectric layer 112 is then formed overlying barrier layer 104. In one embodiment, interlevel dielectric layer 112 comprises dielectric layer 106, etch stop layer 108 and dielectric layer 110.

Dielectric layer 106 may be a layer of plasma deposited oxide which is deposited using TEOS as a source gas. Alternatively, dielectric layer 106 may be a layer of PSG, a layer of BPSG, an SOG layer, a polyimide layer, a low dielectric constant insulator, or the like.

Etch stop layer 108 may be a layer of plasma deposited silicon oxynitride. Alternatively, etch stop layer 108 may be a layer of plasma deposited silicon nitride, a layer of born nitride, or the like.

Dielectric layer 110 may be a layer of plasma deposited oxide which is formed using TEOS as a source gas. Alternatively, dielectric layer 110 may be a layer of PSG, a layer of BPSG, an SOG layer, a polyimide layer, a low dielectric constant insulator, or the like. It should be appreciated that interlevel dielectric layer 112 need not be formed using a different dielectric material. For example, interlevel dielectric layer 112 could be formed using a single dielectric material, such as plasma deposited oxide, PSG, BPSG, SOG, polyimide, a low dielectric constant insulator, or the like.

A portion of interlevel dielectric layer 112 is then patterned to form dual inlaid openings within interlevel dielectric layer 112. The dual inlaid openings comprise an interconnect portion and a via portion, wherein the via portions expose a portion of conductive interconnects 102. During the patterning process etch stop layer 108 protects dielectric layer 106 when dielectric layer 110 is etched to form the interconnect portions.

A conductive barrier layer, a catalytic layer, a conductive seed layer, and a conductive metal layer are then formed within the dual inlaid openings as previously described in FIG. 7 and FIG. 8. Portions of the conductive metal layer, the conductive seed layer, the catalytic layer, and the conductive barrier layer are then removed, as previously described in FIG. 8, to form conductive interconnects 118 within the dual inlaid openings, wherein conductive interconnects 118 comprise a remaining portion 114 of the conductive barrier layer, a remaining portion 115 of the catalytic layer, a remaining portion 116 of conductive seed layer, and a remaining portion 117 of the conductive metal layer.

A barrier layer 120 is then formed overlying conductive interconnects 118. In one embodiment, barrier layer 120 is a layer of plasma deposited silicon nitride. Alternatively, barrier layer 120 may be a layer of plasma deposited silicon oxynitride, a layer of boron nitride, or the like. Barrier layer 120 is used to prevent metal atoms within conductive interconnects 118 from diffusing into overlying dielectric layers which are subsequently deposited over conductive interconnects 118. For example, if conductive interconnects 118 comprise copper then barrier layer 120 serves as a copper diffusion barrier.

It should be appreciated that the foregoing steps may be repeated in order to fabricate additional levels of conductive interconnects.

Thus it is apparent that there has been provided, in accordance with the present invention, a metallization process that deposits highly conformal films within high aspect ratio openings that can be used to form reliable interconnect structures with low resistance in high aspect ratio openings. Although the invention has been described and illustrated with reference to specific embodiments, it is not intended that the invention be limited to these illustrative embodiments. Those skilled in the art will recognize that modifications and variations may be made without departing from the spirit and scope of the invention. Therefore, it is intended that this invention encompass all variations and modifications as fall within the scope of the appended claims.

What is claimed is:

1. A method for forming an interconnect structure in a semiconductor device comprising the steps of:

providing a semiconductor substrate;

forming a tungsten plug overlying the semiconductor substrate;

forming a dielectric layer overlying the tungsten plug;

removing a portion of the dielectric layer to expose at least a portion of the tungsten plug within an opening;

forming a catalytic layer comprising a palladium-tin alloy within the opening;

forming a conductive seed layer within the opening and overlying the catalytic layer, wherein the conductive seed layer is formed using an electroless plating process; and forming a conductive metal layer overlying the conductive seed layer, wherein the conductive metal layer is formed using an electroplating process.

2. The method of claim 1, further comprising the step of:

forming a barrier layer within the opening prior to forming the catalytic layer.

3. The method of claim 2, wherein the step of forming the barrier layer is further characterized as forming a barrier layer comprising titanium (Ti).

4. The method of claim 2, wherein the step of forming the barrier layer is further characterized as forming a barrier layer comprising tantalum (Ta).

5. The method of claim 2, wherein the step of forming the barrier layer is further characterized as forming a barrier layer comprising tungsten (W).

6. The method of claim 2, further comprising the step of:

etching the barrier layer prior to forming the catalytic layer.

7. The method of claim 1 wherein the step of forming a conductive metal layer further comprises:

forming a conductive metal layer overlying the conductive seed layer, wherein the conductive metal layer is formed using an electroplating process wherein the opening is aluminum free.

8. A method for forming an interconnect structure in a semiconductor device comprising the steps of:

providing a semiconductor substrate;

forming a tungsten plug over the substrate;

forming a dielectric layer overlying the semiconductor substrate;

forming an opening within the dielectric layer to expose a portion of the tungsten plug;

forming a catalytic layer comprising a palladium-tin alloy within the opening;

forming a first copper layer within the opening using an electroless plating process after forming the catalytic layer;

forming a second copper layer within the opening using an electroplating process, wherein the second copper layer abuts the first copper layer and the first copper layer serves as a seed layer for the electroplating process; and polishing the second copper layer and the first copper layer to form a conductive interconnect within the opening.

9. The method of claim 8, wherein the step of forming the opening is further characterized as forming a dual inlaid opening.

10. The method of claim 8, further comprising the step of:

forming a condutive barrier layer within the opening to forming the catalytic layer.

11. The method of claim 10, wherein the step of forming the conductive barrier layer is further characterized as forming a barrier layer comprising tantalum (Ta).

12. The method of claim 11, wherein the step of forming the barrier layer comprising tantalum is further characterized as forming a tantalum nitride barrier layer.

13. The method of claim 10, wherein the step of forming the conductive barrier layer is further characterized as forming a titanium nitride barrier layer.

14. A method for forming an interconnect structure in a semiconductor device comprising the steps of:

providing a semiconductor substrate;

forming a doped region within the semiconductor substrate;

forming a tungsten plug over the substrate;

forming a first dielectric layer overlying the semiconductor substrate;

forming a first opening within the first dielectric layer to expose a portion of a tungsten plug;

forming a first conductive barrier layer within the first opening;

forming a first catalytic layer comprising a palladium-tin alloy within the first opening, the first catalytic layer overlying the first conductive barrier layer;

forming a first conductive seed layer within the first opening using an electroless plating process, the first conductive seed layer overlying the first conductive barrier layer; and forming a first copper layer with the first opening using an electroplating process, the first copper layer overlying the first conductive seed layer;

polishing the first copper layer to form a first conductive interconnect;

forming a second dielectric layer overlying the first conductive interconnect;

forming a second opening in the second dielectric layer to expose a portion of the first conductive interconnect;

forming a second conductive barrier layer within the second opening;

forming a second catalytic layer comprising a palladium-tin alloy within the second opening, the second catalytic layer overlying the second conductive barrier layer;

forming a second conductive seed layer within the second opening using an electroless plating process, the second conductive seed layer overlying the second conductive barrier layer;

forming a second copper layer within the second opening using an electroplating process, the second copper layer overlying the second conductive seed layer; and polishing the second copper layer to form a second conductive interconnect.

15. The method of claim 14, wherein the step of polishing the first copper layer is further characterized as polishing the first copper layer to form a first conductive interconnect adjacent to the doped region, wherein the first conductive interconnect is electrically shorted to the doped region.

* * * * *

UNITED STATES PATENT AND TRADEMARK OFFICE
CERTIFICATE OF CORRECTION

PATENT NO. : 6,197,688 B1  Page 1 of 1
DATED : March 6, 2001
INVENTOR(S) : Cindy Reidsema Simpson It is certified that error appears in the above-identified patent and that said Letters Patent is hereby corrected as shown below:

Column 11, claim 10,
Line 2, after "opening", add -- prior --

Signed and Sealed this

First Day of January, 2002

Attest:

Attesting Officer

JAMES E. ROGAN
*Director of the United States Patent and Trademark Office*